(12) United States Patent
Uno et al.

(10) Patent No.: US 10,355,447 B2
(45) Date of Patent: Jul. 16, 2019

(54) LASER DEVICE

(71) Applicant: SHIMADZU CORPORATION, Nakagyo-Ku, Kyoto-Shi, Kyoto (JP)

(72) Inventors: Shingo Uno, Kyoto (JP); Tomoyuki Hiroki, Kyoto (JP); Kazuma Watanabe, Kyoto (JP)

(73) Assignee: SHIMADZU CORPORATION, Kyoto (JP)

(*) Notice: Subject to any disclaimer, the term of this patent is extended or adjusted under 35 U.S.C. 154(b) by 0 days.

(21) Appl. No.: 15/981,180

(22) Filed: May 16, 2018

(65) Prior Publication Data
US 2018/0342852 A1   Nov. 29, 2018

(30) Foreign Application Priority Data

May 29, 2017   (JP) .................... 2017-105420

(51) Int. Cl.
| | |
|---|---|
| *H01S 5/0683* | (2006.01) |
| *H01S 5/40* | (2006.01) |
| *H01S 5/042* | (2006.01) |
| *H01S 5/068* | (2006.01) |
| *H01S 5/062* | (2006.01) |

(52) U.S. Cl.
CPC .......... *H01S 5/06835* (2013.01); *H01S 5/042* (2013.01); *H01S 5/0428* (2013.01); *H01S 5/06808* (2013.01); *H01S 5/4012* (2013.01); *H01S 5/4018* (2013.01); *H01S 5/4025* (2013.01); *H01S 5/06216* (2013.01)

(58) Field of Classification Search
CPC ............. H01S 5/06835; H01S 5/06216; H01S 5/40–426; H01S 5/4012; H01S 5/06233; H01S 3/1304; H01S 5/0427; H01S 5/0428; H01S 5/06; H01S 5/062; H01S 5/06253; H01S 5/06808; H01S 5/4018
See application file for complete search history.

(56) References Cited

U.S. PATENT DOCUMENTS 4,835,780 A * 5/1989 Sugimura ........... H01S 5/06216
372/29.01
4,888,777 A * 12/1989 Takeyama .......... H01S 5/06216
372/29.01

(Continued)

FOREIGN PATENT DOCUMENTS

| JP | H10-256606 | 9/1998 | | |
|---|---|---|---|---|
| WO | WO-2012107815 A2 * | 8/2012 | ......... | H01S 5/06216 |
| WO | WO-2017025958 A1 * | 2/2017 | ......... | H01S 5/06216 |

*Primary Examiner* — Joshua King
(74) *Attorney, Agent, or Firm* — Andrew F. Young, Esq.; Lackenbach Siegel, LLP (57) ABSTRACT

A laser device suppresses the variation of each time-lag so that a distortion of a combined laser output is suppressed. The laser device includes electric current control elements Q1, Q2 connected in series to a laser diode unit corresponding to respective laser diode units LD1, LD2, an electric current control circuit 11 that controls an electric current flow in the laser diode unit by adding a voltage to a control terminal of the electric current control element to turn on the electric current control element, and voltage adjustment circuits 12a, 12b corresponding to the laser diode unit adjusts, individually, every laser diode unit and the voltage that is added to the control terminal of the electric current control element when the laser diode is off.

7 Claims, 5 Drawing Sheets

(56) References Cited

U.S. PATENT DOCUMENTS

| | | | | |
|---|---|---|---|---|
| 5,465,264 A * | 11/1995 | Buhler | ............... | H01S 5/06216 372/31 |
| 6,064,682 A * | 5/2000 | Vickers | ............... | H01S 5/06216 372/25 |
| 6,344,641 B1 * | 2/2002 | Blalock | ............... | G09G 3/3406 250/205 |
| 7,599,412 B2 * | 10/2009 | Vogel | ............... | G11B 7/126 372/29.015 |
| 8,811,441 B2 * | 8/2014 | Ishida | ............... | G02B 26/127 372/38.02 |
| 2005/0276291 A1 * | 12/2005 | Nishimura | ............... | H01S 5/0683 372/38.02 |
| 2009/0316743 A1 * | 12/2009 | Alfrey | ............... | H01S 5/042 372/38.04 |
| 2012/0250713 A1 * | 10/2012 | Maeda | ............... | H01S 5/0428 372/38.02 |
| 2013/0094529 A1 * | 4/2013 | Wakabayashi | ............... | H01S 3/0057 372/27 |
| 2013/0156061 A1 * | 6/2013 | Johansson | ............... | H01S 5/40 372/50.12 |
| 2014/0139603 A1 * | 5/2014 | Fujita | ............... | H01S 5/0427 347/118 |
| 2017/0149208 A1 * | 5/2017 | Zhang | ............... | H01S 5/0428 |
| 2017/0365980 A1 * | 12/2017 | Pfeiffer | ............... | H01S 5/0617 |

\* cited by examiner

FIG. 1

PRIOR ART

LASER DEVICE

CROSS REFERENCE TO RELATED APPLICATIONS

This application relates to, and claims priority from, JP 2017-105420, filed May 29, 2017, the entire contents of which are incorporated herein by reference.

FIGURE SELECTED FOR PUBLICATION

FIG. 2

BACKGROUND OF THE INVENTION

Field of the Invention

The present invention relates to a laser device that drives a plurality of semiconductor lasers, and particularly, relates to a technology that controls the delay time (time-lag) between the timing when the laser is turned on and the beginning of the a laser oscillation.

Description of the Related Art

Figure 1:
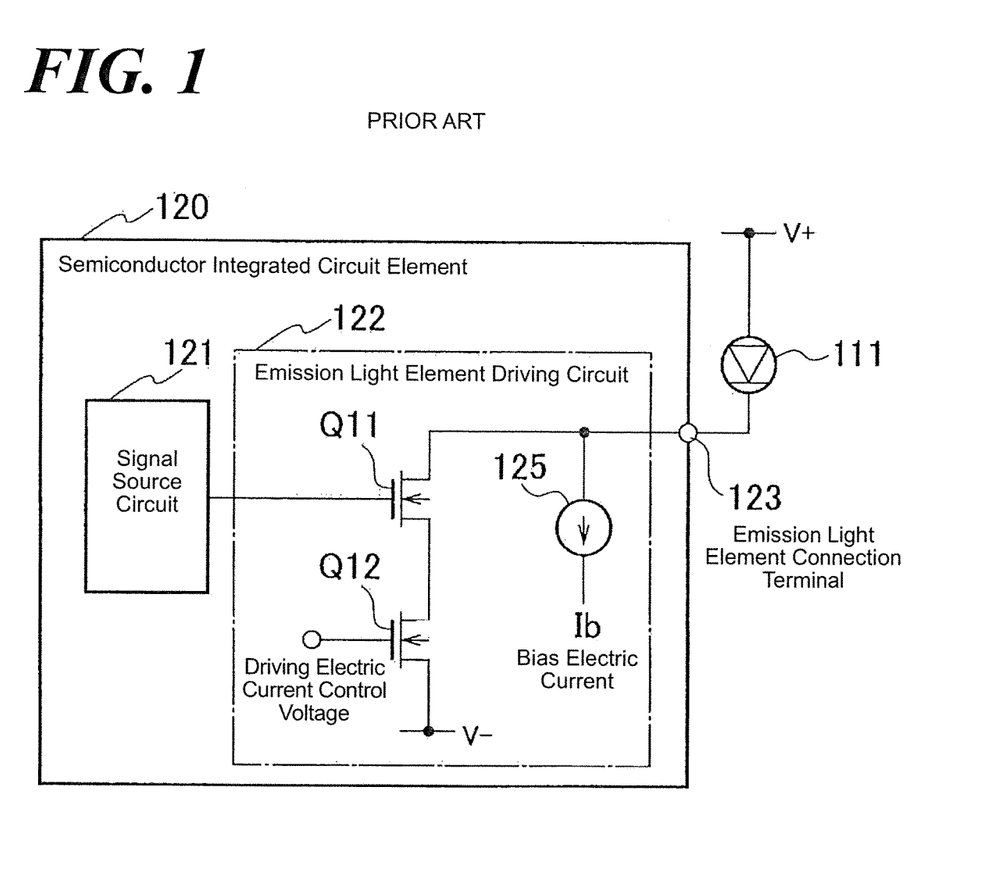
FIG. 1 is a diagram illustrating a structure of the conventional laser device.

With regard to a conventional laser device, the technology that generates a high-speed pulse by turning on a bias electric current for a semiconductor laser is known. FIG. 1 is a diagram illustrating a structure of such conventional laser device (Patent Document 1).

Referring to FIG. 1, an electric voltage around the threshold voltage can be added to the gate of MOSFET (metal-oxide-semiconductor field-effect transistor) Q12 (MOSFET Q12 gate), which is an electric current control element even when the semiconductor laser is off by flowing the bias electric current from the bias electric current source 125 to the emission light element 111 consisting of a semiconductor laser, Therefore, the electric current flows to the emission element 111 immediately after the semiconductor laser is turned on. The semiconductor laser outputs the natural emission light when the bias electric current flows to the semiconductor laser.

Regardless, relative to the exposure device, some applications require that even natural emission light must be cut when the laser is off. In such case, the semiconductor laser must be assuredly off by setting the MOSFET Q12 gate voltage lower than the threshold voltage.

RELATED PRIOR ART DOCUMENTS

Patent Document

Patent Document 1: JPH 10-256606

ASPECTS AND SUMMARY OF THE INVENTION

Objects to be Solved

However, when the MOSFET Q12 gate voltage is lower than the threshold voltage, the gate voltage must be controlled so that the predetermined electric current flows over the threshold voltage.

However, the time needed for such control varies depending on the individual difference of the MOSFET, the RC constant of the resistance R of feedback-control circuit and the condenser C, and the operational amplifier. Therefore, the time-lag between the timing of the laser-on signal and the beginning of the laser oscillation varies. In addition, when a plurality of the semiconductor lasers is combined followed by driven, each time-lag varies from the semiconductor laser to the semiconductor laser, so that the combined laser output distortion takes place when a plurality of laser outputs is combined.

The purpose of the present invention is to prove a laser device that suppresses the variation of each time-lag so that a distortion of the combined laser output can be suppressed.

Means for Solving the Problem

To solve the above problems, a laser device, according to the present invention, comprises: a plurality of laser diode units of which each laser diode unit comprises at least one of a one-laser diode and a plurality of laser diodes in series; a plurality of electric current control elements that is installed corresponding to the plurality of the laser diode units and connected to the laser diode unit in series; an electric current control circuit that controls an electric current, which flows to the plurality of laser diode units, by adding a voltage to a control terminal of the plurality of electric current control elements to turn on the plurality of the electric current control elements; a plurality of voltage adjustment circuits that is installed corresponding to said plurality of laser diode units and adjusts the voltage added to a control terminal of the electric current control element each and every laser diode unit individually to be lower than a threshold when the plurality of laser diodes is off; and a plurality of adders that is installed corresponding to the plurality laser diodes and adds an added voltage, which is obtained by adding said voltage from said electric current control circuit and an adjustment voltage that is adjusted by said voltage adjustment circuit to be lower than the threshold, to a control terminal of said electric current control element; wherein each of the plurality of voltage adjustment circuits adjusts the adjustment voltage so that a plurality of start-up timings of a light-output of the plurality of the laser diode units align. When the laser diode unit comprises only a one-laser diode, the start-up timing can be aligned more accurately compared to the case of the plurality thereof.

Effect of the Invention

According to the aspect of the present invention, a plurality of the voltage adjustment circuits individually adjusts the voltage that is added to the control terminal of the electric current control elements of each and every laser diode unit when the laser diode is off and also adjusts the adjustment voltage to align a plurality of start-up timings of the light-outputs of the plurality of the laser diode units.

Accordingly, the present invention can provide the laser device that suppresses the variation of each time-lag, so that the distortion of the combined laser output can be suppressed.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

It will be further understood by those of skill in the art that the apparatus and devices and the elements herein, without limitation, and including the sub components such as operational structures, circuits, communication pathways, and related elements, control elements of all kinds, display circuits and display systems and elements, any necessary driving elements, inputs, sensors, detectors, memory elements, processors and any combinations of these structures etc. as will be understood by those of skill in the art as also being identified as or capable of operating the systems and devices and subcomponents noted herein and structures that accomplish the functions without restrictive language or label requirements since those of skill in the art are well versed in related laser device fields, laser circuits, computer and operational controls and technologies of laser devices and all their sub components, including various circuits and combinations of circuits without departing from the scope and spirit of the present invention.

Embodiment 1

Figure 2:
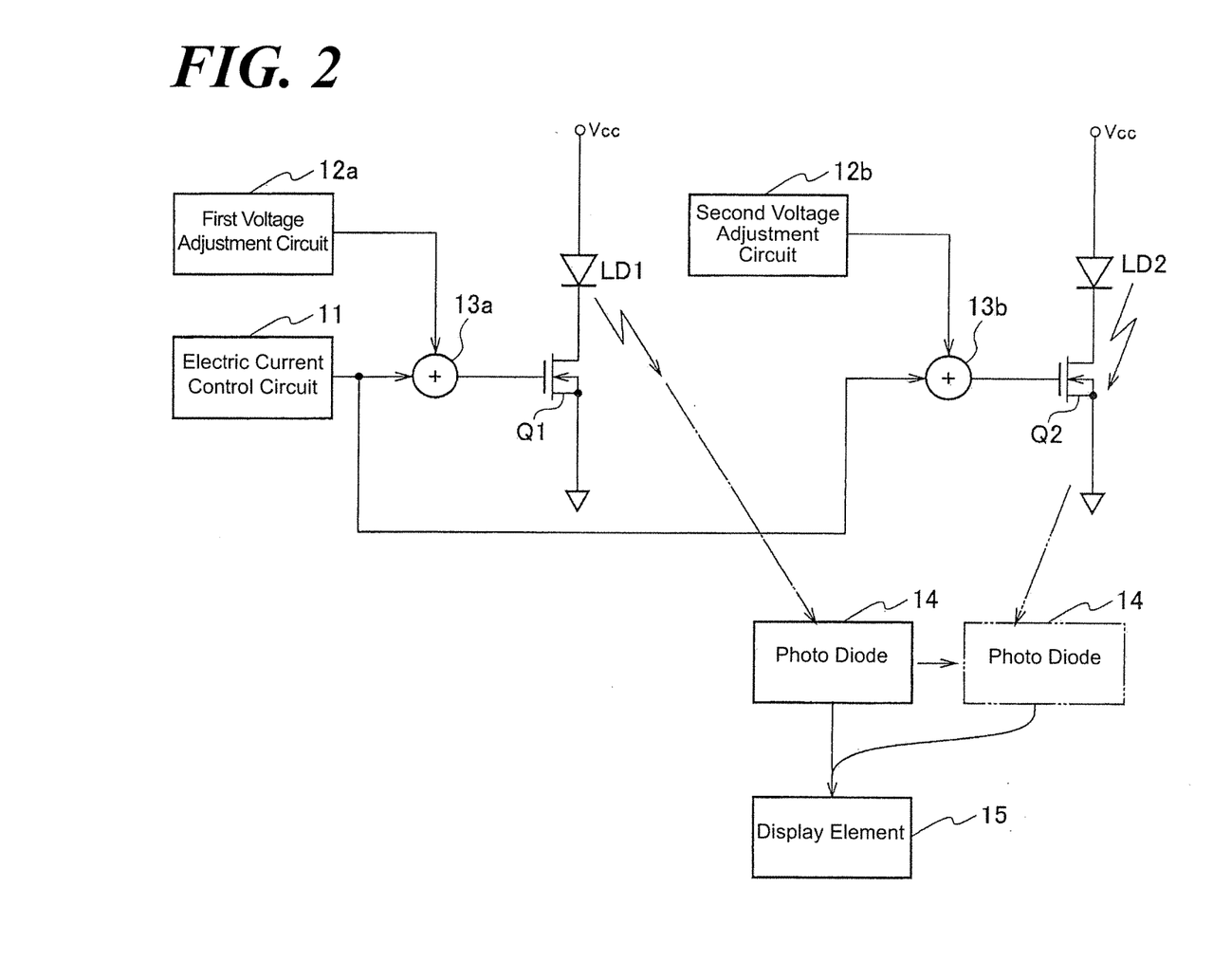
FIG. 2 is a timing chart illustrating the operation of each element of the laser device according to the aspect of the Embodiment 1 of the present invention.

Hereinafter, referring to FIGs., the inventors set forth further detail of a laser device according to the aspect of the Embodiment of the present invention. FIG. 2 is a diagram illustrating a structure of the laser device according to the aspect of the Embodiment 1 of the present invention. Referring to FIG. 2, the laser device, according to the aspect of the Embodiment 1, comprises the laser diode units LD1, LD2; MOSFET Q1, Q2; the electric current control circuit 11; the first voltage adjustment circuit 12a, the second voltage adjustment circuit 12b; the adders 13a, 13b; the photo diode 14; and the display element 15.

According to the aspect of the Embodiment 1, the laser diode units LD1, LD2, MOSFET Q1, Q2, the first voltage adjustment circuit 12a, the second voltage adjustment circuit 12b; the adders 13a, 13b; are respectively two, but the more than three thereof can be installed.

The laser diode units LD1, LD2 corresponds to a plurality of laser diode units of the present invention. Each of the laser diode units LD1, LD2 is connected to one-laser diode or a plurality of laser diode units in series, an anode is connected to a power source Vcc, a cathode is connected to a drain of the MOSFET Q1, Q2 despite not showing in FIG., and the laser light is output when the electric current flows.

MOSFET Q1, Q2 corresponds to the electric current control element of the present invention are installed to correspond to the laser diode units LD1, LD2, wherein the drain is connected to the cathode of the laser diode units LD1, LD2, the source is connected to the reference potential (e.g., ground), and the gate is connected to the output side of the adders 13a, 13b.

The electric current control circuit 11 controls the electric current, which flows in the laser diode units LD1, LD2, by adding a pulse voltage to the, MOSFET Q1, Q2 gates to turn on the MOSFET Q1, Q2.

The first voltage adjustment circuit 12a and the second voltage adjustment circuit 12b are installed to correspond to the laser diode units LD1, LD2 and adjust the voltage added to the MOSFET Q1, Q2 gates each and every laser diode units LD1, LD2 individually to be lower than a threshold when the laser diode units LD1, LD2 are off.

The adders 13a, 13b are installed to correspond to the laser diode units LD1, LD2 and adds an added voltage, which is obtained by adding the voltage from the electric current control circuit 11 and the adjustment voltage that is adjusted by the voltage adjustment circuits 12a, 12b to be lower than the threshold, to the MOSFET Q1, Q2 gates (corresponding to the control terminal of the present invention).

Each of the voltage adjustment circuits 12a, 12b adjusts the adjustment voltage, so that the start-up timings of the light-output of the laser diode units LD1, LD2 align.

A photo diode 14 corresponding to a light detector of the present invention detects the light-output from the laser diode units LD1, LD2. A display element 15 corresponding to a waveform display element, e.g., oscilloscope and so forth, of the present invention displays the time-course variation of the waveform, which the photo diode 14 detects, of the light-output of the laser diode units LD1, LD2.

Each of the voltage adjustment circuits 12a, 12b adjusts the adjustment voltage so that the two start-up timings of the light-output of the laser diode units LD1, LD2 align based on the time-variation of waveform, which the display element 15 displays, of the light-output of the laser diode units LD1, LD2.

Next the inventors set forth an operation of the laser device according to the aspect of the Embodiment 1. First, referring to the timing chart of FIG. 3, the inventors set forth the operation of each element of the conventional laser device. In addition, the conventional circuit, referring to FIG. 1, includes none of voltage adjustment circuits 12a, 12b; the adders 13a, 13b; the photo diode 14; and the display element 15.

Figure 3:
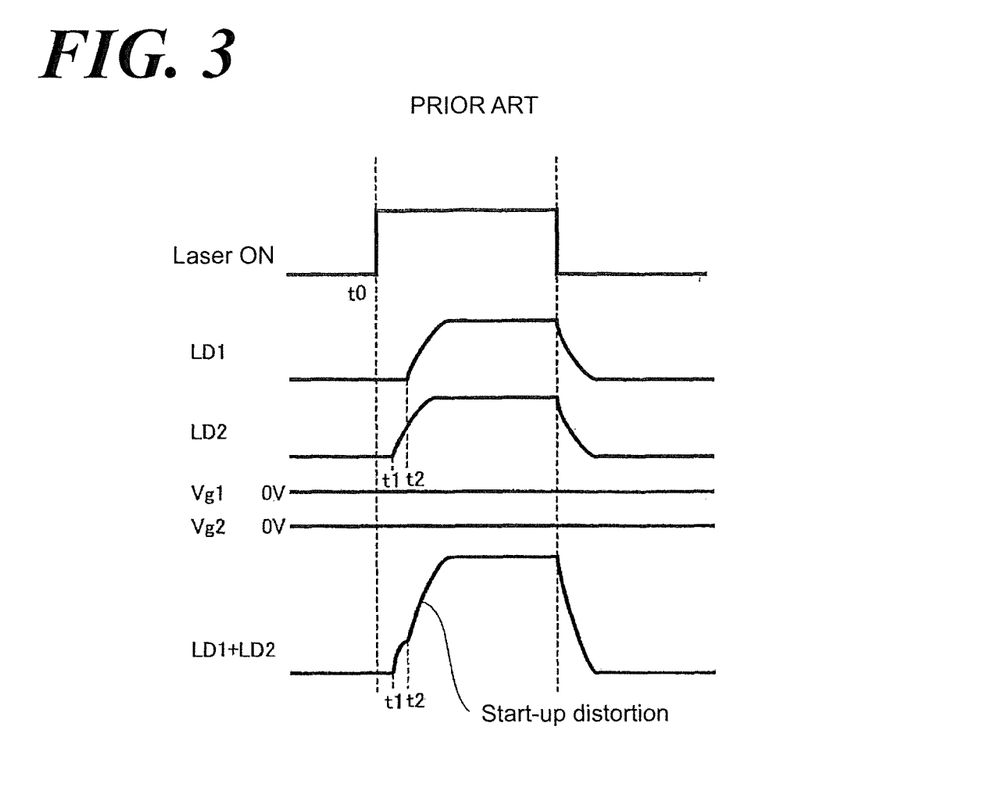
FIG. 3 is a timing chart illustrating the operation of each element of the conventional laser device.

Referring to FIG. 3, the MOSFET Q1, Q2 are turned on by adding the voltage from the electric current control circuit 11, e.g., 0V, to the MOSFET Q1, Q2 gates as the gate voltage (Vg1, Vg2) at time t0. Specifically, when the laser is turned on at time t0, the laser diode unit LD2 starts up to be on as time t1. Next, the laser diode unit LD1 starts up to be on as time t2.

The start-up timing shifts to t1, t2 due to a variation of the individual difference of the MOSFET Q1, Q2 as set forth relative to the conventional technology. Therefore, referring to FIG. 3, when the light-output of the laser diode unit LD1 and the light-output laser diode unit LD2 are combined, the start-up distorts.

In contrast, the laser device, according to the aspect of the Embodiment 1, outputs the voltage from the electric current control circuit 11, e.g., 0V, to the adders 13a, 13b. In addition, when the adjustment voltage from the first voltage adjustment circuit 12a, e.g., 0V, is output to the adder 13a, 0V (Vg1) is added to the MOSFET Q1 gate. Therefore, referring to FIG. 2, the light-output of the laser diode unit LD1 starts up at time t2.

The photo diode 14 detects the light-output of the laser diodes unit LD1 and the display element 15 displays the time variation of the waveform of the light-output of the laser diode units LD1, which the photo diode 14 detects. Therefore, it can be visually recognized that the light-output of the laser diode unit LD1 starts up at time t2.

In addition, when the adjustment voltage from the second voltage adjustment circuit 12b, e.g., 0V, is output to the adder 13b, 0V (Vg2) is added to the MOSFET Q2 gate. Therefore, referring to FIG. 2, the light-output of the laser diode unit LD2 starts up at time t1.

Next, the photo diode 14 shifts to detect the light-output of the laser diodes unit LD2 and the display element 15 displays the time variation of the waveform, which the photo diode 14 detects, of the light-output of the laser diode unit LD2. Therefore, it can be visually recognized that the light-output of the laser diode unit LD2 starts up at time t1.

Next, referring to FIG. 3 that the display element 15 displays, the second voltage adjustment circuit 12b corresponding to the start-up timing t1, which is the residual timing obtained by removing the latest start-up timing t2 from two start-up timings t1, t2, adjusts the adjustment voltage (gate voltage Vg2a) as a negative voltage (e.g., −0.2V) to align the start-up timing with the latest timing t2.

Specifically, the start-up timing of the light-output timing of the laser diode unit LD2 is forced to delay by lowering the threshold voltage from 0V to −0.2V, so that the start-up timings can align with the latest start-up timing t2.

Figure 4:
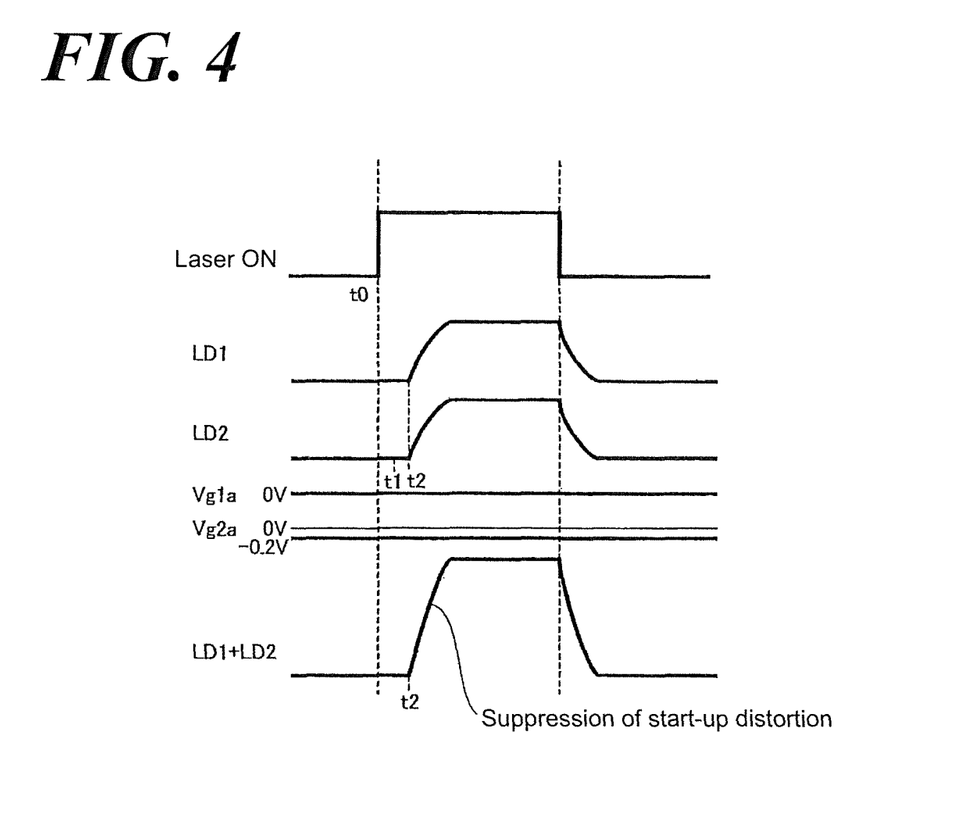
FIG. 4 is a timing chart illustrating the operation of each element of the laser device according to the aspect of the Embodiment 1 of the present invention.

Therefore, referring to FIG. 4, when the light-output of the laser diode unit LD1 and the light-output laser diode unit LD2 are combined, the start-up distortion can be suppressed.

In addition, according to the aspect of the Embodiment 1, the second voltage adjustment circuit 12b adjusts the adjustment voltage (gate voltage Vg2a) as a negative voltage (e.g., −0.2V) to align the start-up timing with the latest timing t2. For example, according to the aspect of the Embodiment 1, the first voltage adjustment circuit 12a adjusts the adjustment voltage (gate voltage Vg21) as a positive voltage (e.g., +0.2V) to align the start-up timing with the fastest timing t1.

With regard to the laser device according to the aspect of the Embodiment 1, a plurality of the voltage adjustment circuits 12a, 12b individually adjusts the voltage that is added to the, MOSFET Q1, Q2 gates each and every laser diode units LD1, LD2 to be lower than the threshold when the laser diode units LD1, LD2 are off and also adjusts the adjustment voltage to align two start-up timings of the light-output of the laser diode units LD2, LD2.

Accordingly, the present invention can provide the laser device that suppresses the variation of each time-lag, so that the distortion of the combined laser output can be suppressed. In addition, a plurality of the lasers can be simultaneously turned on-and-off, the laser lights can be effectively combined.

Embodiment 2

Figure 5:
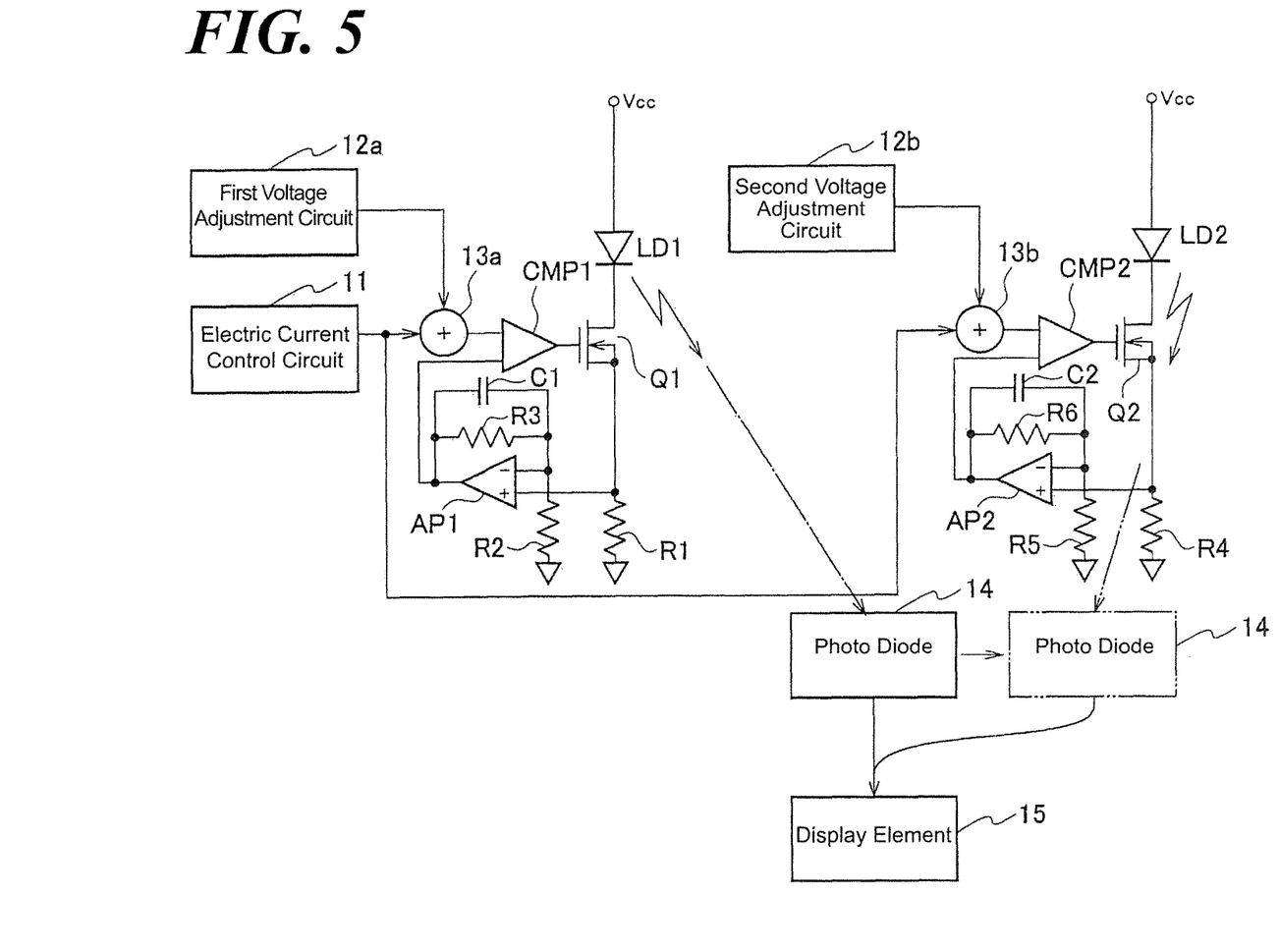
FIG. 5 is a diagram illustrating a structure of the laser device according to the aspect of the Embodiment 2 of the present invention.

FIG. 5 is a diagram illustrating a structure of the laser device according to the aspect of the Embodiment 2 of the present invention. Referring to FIG. 4, the laser device according to the aspect of the Embodiment 2, comparing with the laser device according to the aspect of the Embodiment 1 referring to FIG. 5, further comprises a feedback control circuit including resistances R1-R6, amplifiers AP1, AP2, condensers C1, C2, and comparators CMP1, CMP2.

The one-end of the resistance R1 and the non-inverted input terminal (+) of the amplifier AP1 are connected to the source of the MOSFET Q1, and the other end of the resistance R1 is connected to the reference potential. The one-end of the resistance R2, the one-end of the resistance R3 and the one-end of the condenser C1 are connected to the non-inverted input terminal (−) of the amplifier AP1 and the other end of the resistance R2 is connected to the reference potential.

The other end of the resistance R3, the other end of the condenser C1, and the other end of the comparator CMP1 are connected to the output terminal of the amplifier AP1. The output of the adder 13a is connected to the other input terminal of the comparator CMP1 and the output terminal of the comparator CMP1 is connected to the MOSFET Q1 gate.

The one-end of the resistance R1 and the non-inverted input terminal (+) of the amplifier AP1 are connected to the source of the MOSFET Q1, and the other end of the resistance R1 is connected to the reference potential. The one-end of the resistance R2, the one-end of the resistance R3 and the one-end of the condenser C1 are connected to the inverted input terminal (−) of the amplifier AP1 and the other end of the resistance R2 is connected to the reference potential.

The one-end of the resistance R4 and the non-inverted input terminal (+) of the amplifier AP2 are connected to the source of the MOSFET Q2, and the other end of the resistance R4 is connected to the reference potential. The one-end of the resistance R5, the one-end of the resistance R6 and the one-end of the condenser C2 are connected to the inverted input terminal (−) of the amplifier AP2 and the other end of the resistance R5 is connected to the reference potential.

The other end of the resistance R6, the other end of the condenser C2, and the other end of the comparator CMP2 are connected to the output terminal of the amplifier AP2. The output of the adder 13b is connected to the other input terminal of the comparator CMP2 and the output terminal of the comparator CMP2 is connected to the MOSFET Q2 gate.

The laser device, according to the aspect of the Embodiment 2, detects the electric current flows in the resistances R1, R4 and inputs the voltage corresponding to the detected electric current to the non-inverted input terminal (+) of the amplifiers AP1, AP2. The amplifiers AP1, AP2 amplify the voltage input to the non-inverted input terminal (+), and the comparators CMP1, CMP2 compare the voltage from the adders 13a, 13b and voltage from the amplifiers AP1, AP2 and add the comparison output to the, MOSFET Q1, Q2 gates.

Specifically, the feedback control can control the electric current flowing in the laser diode units LD1, LD2 to be a constant value.

In addition, even when the MOSFET Q1, Q2, the resistances R1-R6, the condensers C1, C2, the amplifiers AP1, AP2, the comparators CMP1, CMP2 and so forth vary, as well as the Embodiment 1, the first voltage adjustment circuit 12a and the second voltage adjustment circuit 12b individually adjust the voltage that is added to the MOSFET Q1, Q2 gates each and every laser diode units LD1, LD2 to be lower than the threshold when the laser diode units LD1, LD2 are off and also adjusts the adjustment voltage to align two start-up timings of the light-output of the laser diode units LD2, LD2.

Accordingly, the present invention can provide the laser device that suppresses the variation of each time-lag so that the distortion of the combined laser output can be suppressed. In addition, a plurality of the lasers can be simultaneously turned on-and-off, the laser lights can be effectively combined.

INDUSTRIAL APPLICABILITY

The present invention is applicable to a laser machining device.

REFERENCE OF SIGNS

11 Electric current control circuit
12a First voltage adjustment circuit
12b Second voltage adjustment circuit
13a, 13b Adder
14 Photo diode
15 Display element
Vcc Power source
LD1, LD2 Laser diode unit
Q1, Q2 MOSFET
AP1, AP2 Amplifier
CMP1, CMP2 Comparator
R1-R6 Resistance
C1, C2 Condenser Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A laser device comprising:
a plurality of laser diode unit of which each laser diode unit further comprises at least one of a one-laser diode and a plurality of laser diodes in series;
a plurality of electric current control elements that is installed respectively corresponding to said plurality of the laser diode units and is connected to each said laser diode unit in series;
an electric current control circuit that controls an electric current, which flows to said plurality of laser diode units, by adding a voltage to a control terminal of each of said plurality of the electric current control elements to respectively turn on each of said plurality of the electric current control element;
a plurality of voltage adjustment circuits that is installed respectively corresponding to said plurality of laser diode units and each said voltage adjustment circuit individually adjusts the voltage added to a control terminal of each said electric current control element of each said and every laser diode unit to be lower than a determined threshold when said plurality of laser diodes is off;
a plurality of adders that is installed respectively corresponding to the plurality laser diodes and adds an added voltage, which is obtained by adding said voltage from said electric current control circuit and an adjustment voltage that is adjusted by said voltage adjustment circuit to be lower than the threshold, to a control terminal of said electric current control element; and
wherein each of said plurality of voltage adjustment circuits adjusts said adjustment voltage so that a plurality of start-up timings of a light-output of said plurality of the laser diode units aligns.

2. The laser device, according to claim 1, further comprising:
a light detector that detects a light-output of said plurality of laser diode units;
a waveform display element that displays a time variation of a waveform of said light-output of said plurality of laser diode units, which said light detector detects; and
wherein each of said plurality of voltage adjustment circuits adjusts respectively said adjustment voltage based on a time-variation of waveform of the light-output of respectively said plurality of laser diode units, which is displayed on said waveform display element so that said plurality of start-up timings of said light-output of said plurality of laser diode units aligns.

3. The laser device according to claim 1, wherein:
at least one said voltage adjustment circuits corresponding to a residual start-up timing obtained by removing a latest start-up timing from each of said plurality of start-up timings and adjusts said adjustment voltage as a negative voltage so that said start-up timings align with said latest start-up timing.

4. The laser device, according to claim 1, further comprising:
a plurality of first resistances, each of which has one-end that is connected respectively to one respective said electric current control element, that is installed corresponding to each of said plurality of the laser diode units;
a plurality of amplifiers, each of which has a non-inverted input terminal that is connected respectively to one-end of each said first resistance and has an inverted input terminal that is connected respectively to an one-end of a second resistance, that is installed corresponding to said plurality of laser diode units, wherein respectively a condenser and a third resistance are connected in parallel between each said inverted input terminal and an output terminal thereof; and further comprising:

a plurality of comparators, each of which that is installed corresponding to each respective said plurality of laser diodes and which compares an amplifier output from said amplifier and an adder output from said adder, and outputs an obtained comparison output to said control terminal of said electric current control element.

5. The laser device according to claim 2, wherein:

at least one said voltage adjustment circuits corresponding to a residual start-up timing obtained by removing a latest start-up timing from each of said plurality of start-up timings and adjusts said adjustment voltage as a negative voltage so that said start-up timings align with said latest start-up timing.

6. The laser device, according to claim 2, further comprising:

a plurality of first resistances, each of which has one-end that is connected respectively to one respective said electric current control element, that is installed corresponding to each of said plurality of the laser diode units;

a plurality of amplifiers, each of which has a non-inverted input terminal that is connected respectively to one-end of each said first resistance and has an inverted input terminal that is connected respectively to an one-end of a second resistance, that is installed corresponding to said plurality of laser diode units, wherein respectively a condenser and a third resistance are connected in parallel between each said inverted input terminal and an output terminal thereof; and further comprising:

a plurality of comparators, each of which that is installed corresponding to each respective said plurality of laser diodes and which compares an amplifier output from said amplifier and an adder output from said adder, and outputs an obtained comparison output to said control terminal of said electric current control element.

7. The laser device, according to claim 3, further comprising:

a plurality of first resistances, each of which has one-end that is connected respectively to one respective said electric current control element, that is installed corresponding to each of said plurality of the laser diode units;

a plurality of amplifiers, each of which has a non-inverted input terminal that is connected respectively to one-end of each said first resistance and has an inverted input terminal that is connected respectively to an one-end of a second resistance, that is installed corresponding to said plurality of laser diode units, wherein respectively a condenser and a third resistance are connected in parallel between each said inverted input terminal and an output terminal thereof; and further comprising:

a plurality of comparators, each of which that is installed corresponding to each respective said plurality of laser diodes and which compares an amplifier output from said amplifier and an adder output from said adder, and outputs an obtained comparison output to said control terminal of said electric current control element.

* * * * *